United States Patent [19]

Iwatsuki et al.

[11] Patent Number: 5,225,993
[45] Date of Patent: Jul. 6, 1993

[54] DESIGN RULE TEST APPARATUS FOR TESTING IF MASK PATTERN SATISFIES DESIGN RULE AND OPERATION METHOD THEREFOR

[75] Inventors: Mamoru Iwatsuki; Masanori Kanehama, both of Hyogo, Japan

[73] Assignee: Mitsubishi Denki Kabushiki Kaisha, Tokyo, Japan

[21] Appl. No.: 655,106

[22] Filed: Feb. 4, 1991

[30] Foreign Application Priority Data

Feb. 17, 1990 [JP] Japan .................................. 2-36632

[51] Int. Cl.⁵ .............................................. G06F 15/60
[52] U.S. Cl. .................................... 364/490; 364/489; 364/488
[58] Field of Search ............... 364/488, 489, 490, 491; 382/8, 33; 356/388

[56] References Cited

U.S. PATENT DOCUMENTS

| | | | |
|---|---|---|---|
| 4,441,207 | 4/1948 | Lougheed et al. | 364/490 |
| 4,510,616 | 4/1985 | Lougheed et al. | 364/490 |
| 5,062,054 | 10/1991 | Kawakami et al. | 364/491 |

OTHER PUBLICATIONS

"Panamap-B: A Mask Verification System for Bipolar TC" by Yoshida et al., IEEE 18th Design Automation Conf., 1981, pp. 690-695.

"Programs for Verifying Circuit Connectivity of MOS/LSI Mask Art Work" by Takashima et al., IEEE 19th Design Automation Conf., 1982, pp. 544-550.

"MACH: A High-Hitting Pattern Checker for VLSI Mask Data", Tsukizoe et al., IEEE 20th Design Automation Conference, 1983.

*Primary Examiner*—Vincent N. Trans
*Attorney, Agent, or Firm*—Lowe, Price, LeBlanc & Becker

[57] ABSTRACT

An improved computer aided design (CAD) apparatus is disclosed for properly determining if a mask pattern for a large-scale integrated circuit (LSI) satisfies a predetermined design rule. This CAD apparatus includes a figure feature file for storing in advance the feature of the configuration of a contact hole region which should not be recognized as a design error. After a conventional design recognizing process has been conducted, a recognition invalidation process is effected by referring to the figure feature file. Accordingly, the detection of a pseudo-error which is not an essential error is reduced, so that the efficiency of a designing operation with this apparatus is improved.

9 Claims, 8 Drawing Sheets

Na = 10

Na = 6

Na = 8

Na = 12

Na = 8

Na = 8

Na = 14

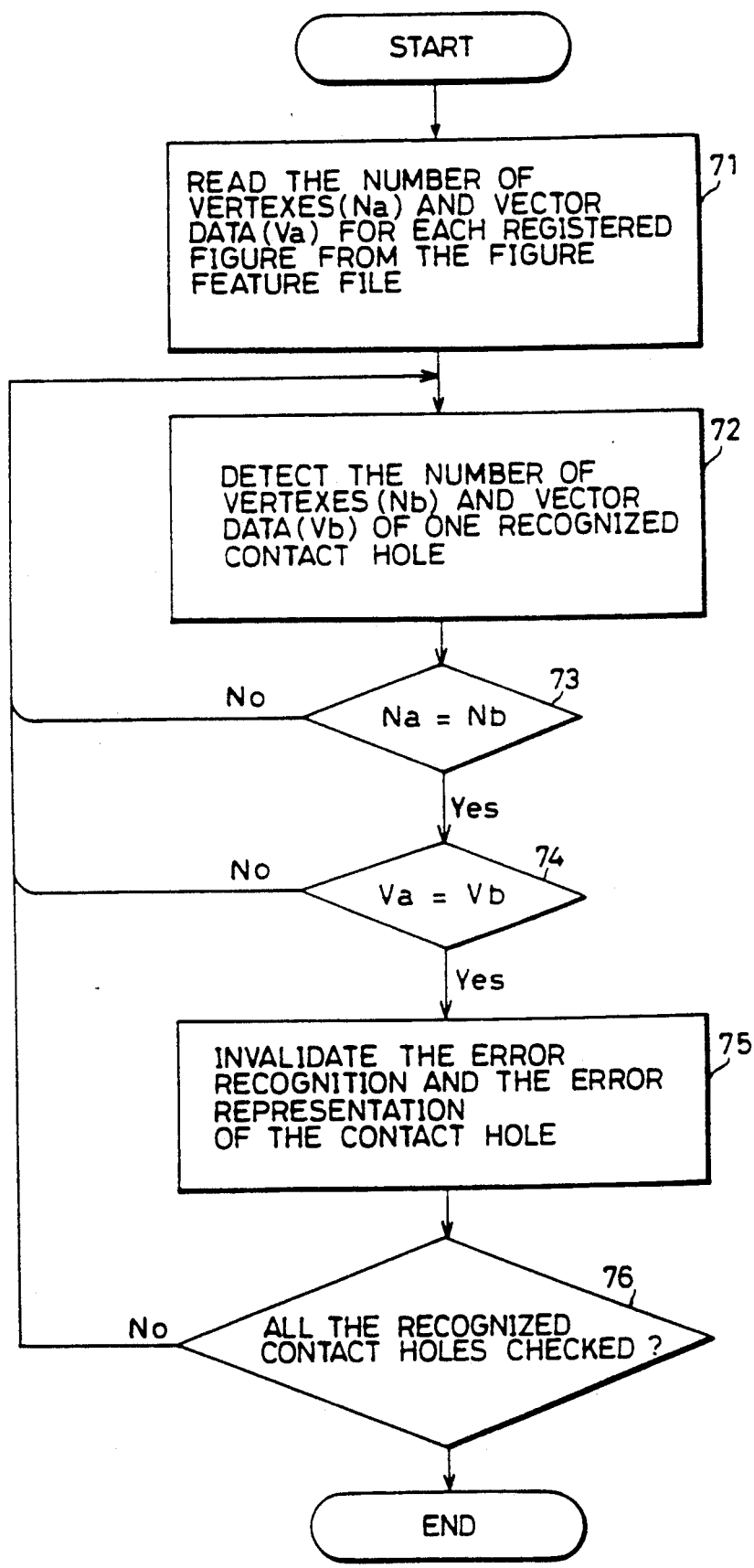

DESIGN RULE TEST APPARATUS FOR TESTING IF MASK PATTERN SATISFIES DESIGN RULE AND OPERATION METHOD THEREFOR

BACKGROUND OF THE INVENTION

1. Field of the Invention

The invention relates generally to design rule test apparatuses, and more particularly, to a design rule test apparatus for testing if a mask pattern satisfies a design rule. The invention has particular applicability to computer aided design apparatuses for semiconductor integrated circuits.

2. Description of the Background Art

A large number of masks are used in a manufacturing process of a large-scale integrated circuit (hereinafter referred to as LSI). Pattern design of mask is generally conducted in accordance with a predetermined design rule. A design rule is generally determined taking account of processing accuracy in a manufacturing process, electrical characteristics and reliability, and a multiplicity of rules are prepared. A layout is designed to design a mask pattern. In designing a layout, a configuration of a circuit device and each location and orientation within the chip region, interconnection path, and mask patterns used in a manufacturing process are determined.

Generally, a design rule check is made in order to determine if the layout of the designed LSI satisfies a predetermined design rule. Examples of known items to be checked with respect to a design rule are a check of spacing, width, and overlaps of interconnection, and device parameters. In general, a design rule check is conducted by way of computers as designing of LSIs is performed utilizing a computer aided design apparatus (hereinafter referred to as CAD). While a large number of items are prepared as design rule check items, a design rule in a portion where an interconnection region and a contact hole region overlap, is particularly described in the following description.

FIG. 7 is a block diagram of a design rule check apparatus in a CAD system as a background of the present invention. Referring to FIG. 7, this CAD system includes a memory 300, an operation processing portion 400, a CRT 51, a keyboard 52, a mouse 53 and a plotter 54. The memory 300 includes a data file 31 for storing data of mask pattern configured in accordance with a layout design, and a design rule file 32 for storing data defining a variety of design rules. The operation processing portion 400 includes a design error recognition portion for determining if the designed mask pattern held in the mask pattern data file 31 satisfies the design rule in the design rule file, and then recognizing a design error, and an interface portion 43 for connecting input/output devices 51 to 54 to the design error recognition portion 41.

FIG. 8 is a plan view of a layout in the vicinity of a contact hole of a LSI. Referring to FIG. 8, the LSI includes a diffusion layer 7 formed in a semiconductor substrate, a first interconnection layer 4 connected to the diffusion layer 7 by way of the contact hole, and two second interconnection layers 1 and 2 formed on the first interconnection layer 4 over an insulating film. The second interconnection layers 1 and 2 are provided on a contact hole 10 having a width of W.

FIG. 9 is a sectional view of the LSI shown in FIG. 8 seen in the direction of an arrow 9. Referring to FIG. 9, a diffusion layer 7 is formed in a semiconductor substrate 6. A first interconnection layer 4 is connected to the diffusion layer 7 by way of a contact hole 10. An insulating film 3 is formed on the first interconnection layer 4. Second interconnection layers 1 and 2 are formed in the contact hole 10, and on the insulating film 3.

FIG. 10 is a sectional view of the LSI shown in FIG. 8 seen in the direction of an arrow 10. Referring to FIG. 10, a first interconnection layer 4 is connected to a diffusion layer 7. An insulating film 3 is formed over the first interconnection layer 4.

FIG. 11 is a sectional view showing interconnection material left between the second interconnection layers 1 and 2 shown in FIG. 8. Referring to FIG. 11, interconnection material 8 is left between the second interconnection layers 1 and 2, thereby short-circuiting the two interconnection layers 1 and 2. In general, when second interconnection layers 1 and 2 are formed, interconnection material is first formed on the insulating film 3 by way of evaporation. Then the interconnection material formed is patterned to have a predetermined configuration using a lithography and an etching methods. As a result, a predetermined portion of interconnection material is left, forming second interconnection layers 1 and 2. As shown in FIG. 11, however, a case occurs in which the interconnection material between the interconnection layers 1 and 2 cannot be removed completely by way of the etching method.

In order to prevent short-circuit between the interconnection layers 1 and 2 due to the interconnection material 8 left, it is necessary to set the width W of the contact hole 10 shown in 8 to over a predetermined value. The orientation of the width W is the same as that of the two interconnection layers 1 and 2. When the width W is set to over a predetermined value, short-circuit, which is due to the interconnection material 8 left between the interconnection layers 1 and 2 as shown in FIG. 11, is prevented. Accordingly, it is noted that a design rule check should be made in order to determine if the width W of the contact hole exceeds a predetermined value.

In a design rule check apparatus, for the abovementioned reason, there is a test for the width of the contact hole, in which a pseudo-error occurs as in the followings.

FIG. 12 is a plan view showing a relationship between the contact hole region and the interconnection region in layout. In the drawing, occurrence of a true design error and three pseudo-errors is shown. Referring to FIG. 12, four contact hole regions 14 to 17 are formed, with three interconnection layer regions 11 to 13 formed thereon. The width W0 shown in the drawing shows an allowable minimum value of a width of a contact hole which is predefined as a design rule. That is, when two or more interconnection layers are formed on the contact hole, it is required that the width of the contact hole should have at least a minimum value of W0. Therefore, the width W13 of the contact hole region 14 needs to be at or over the minimum value W0 as the interconnection layers 11 and 12 are formed on the contact hole region 14. The contact hole region 14, however, is displayed as a design error because W13 < W0.

The contact holes 15, 16 and 17 are represented as a design error inspite of the fact that none of these is required to be represented as a design error. Before describing the occurrence of a pseudo-error, a description is made as to recognition process in a conventional design error recognition portion 41 in the followings.

FIG. 13 is a flow diagram of the design error recognition portion 41 shown in FIG. 7. Referring to FIG. 13, in the step 61, a logical product operation (AND) is performed with regard to figures in a contact hole region and an interconnection layer region. Areas that are common to both contact hole region and interconnection layer region are detected, and the number of overlapping portions is detected. Then, it is determined if the number of overlapping portions NP is 2 or more (NP≧2) in the step 62. If the number of overlapping portions NP is 1, there is no need to effect the following process with respect to the contact hole region.

If the number of overlapping portions NP is 2 or more, all the widths Wi (i=1, 2, . . . ) of the contact holes are detected in the step 63. All the widths Wi detected are compared with the minimum value W0 in the step 64. If at least one width Wi is below the acceptable minimum value W0, the contact hole region is recognized, and represented as a design error in the step 65. If all the widths Wi are at or above the minimum value W0, it is determined that the contact hole regions satisfy the design rule. In the step 66, it is determined if all the contact hole regions are tested, and the remaining contact hole regions are also subject to the same process as the above mentioned.

As the processing in the design error recognition portion 41 is effected as described above, a case occurs in which it is represented as a design error inspite of the fact that it is not essentially required to be treated as a pseudo-error, i.e., a design error shown in FIG. 12. The contact hole region 15 shown in FIG. 12 overlaps with the interconnection layer region 11 at two portions (NP =2), so that the process of the step 63 is effected. In the step 63, the widths W1 to W4 of this contact hole region 15 are compared with the minimum value W0. As the widths W3 and W4 are below the minimum value W0, this contact hole region 15 is recognized, and represented as a design error. In effect, this contact hole region 15, however, overlaps with a single interconnection layer region 11 at two portions, so that no problem of short-circuit as shown in FIG. 11 occurs. That means there is no need to treat this contact hole region 15 as a design error. Accordingly, it is noted that a pseudo-error occurs.

In the case of the contact hole region 16, this contact hole region 16 overlaps with the interconnection layer regions 11 and 12 at two portions, so that the process of the step 63 is effected. The widths W5 and W6 are above the minimum value W0. It is, however, detected that the width W7 is below the minimum value W0. As a result, this contact hole region 16 is recognized, and displayed as a design error in the step 65. It is apparent that there is also no problem of short-circuit as shown in FIG. 11 in this contact hole region 16. Accordingly, it is also noted that there is no need to treat this contact hole region 16 as a design error in this case.

In the case of the contact hole region 17, the contact hole region 17 overlaps with the interconnection layer regions 12 and 13 at two portions. It is determined that the widths W11 and W12 are below the minimum value W0 in the step 64, so that this contact hole region 17 is recognized, and represented as a design error in the step 65. In this case, however, it is pointed out that there is no problem due to short-circuit between the interconnection layers as in the above-mentioned two cases.

In the CAD system shown in FIG. 7, a large number of contact hole regions are displayed on the CRT 51, which are recognized as a design error by the comparison in the step 64 shown in FIG. 13. In the large number of contact hole regions recognized as a design error, exist together one representing the occurrence of a true design error and the other representing a pseudo-error as described above. Therefore, the operator has to determine if it is true or false with respect to an individual error displayed, referring to the layout displayed on the screen of the CRT 51. A multiplicity of contact hole regions and interconnections are provided in one LSI, so that the number of contact holes recognized as a design error is significant. As a result, it took a long time for an operator to determine it is true or false, reducing the efficiency of designing operation.

SUMMARY OF THE INVENTION

One object of the invention is to prevent an occurrence of a pseudo-error in a design rule test in the design rule test apparatus for a semiconductor integrated circuit.

Another object of the invention is to prevent an occurrence of a pseudo-error in a design rule test in a computer aided design (CAD) apparatus for designing mask patterns of a semiconductor integrated circuit.

Yet another object of the invention is to remove a contact hole practically having no problem from the contact holes recognized not to satisfy the design rule in a computer aided design (CAD) apparatus for designing mask patterns of a semiconductor integrated circuit.

In short, a design rule test apparatus in accordance with the invention includes overlap detection means for detecting the overlap of one contact hole region and an interconnection region, decision means for determining that there are two or more overlapping portions detected in the contact hole region, width comparison means for comparing the width of each portion in the contact hole region determined by the decision means with a predetermined value in accordance with the design rule, recognition means responsive to the result of the comparison by the width comparison means for recognizing the contact hole region as a design error, feature storage file for storing in advance the feature of the configuration of the contact hole region which should not be recognized as the design error, feature comparison means for comparing the feature of the configuration of the contact hole region recognized by the recognition means with the feature stored in the feature storage file, and invalidation means responsive to the result of the comparison by the feature comparison means for invalidating the recognition of the design error by the recognition means.

In operation, in the feature storage file, the feature of the configuration of the contact hole region which should not be recognized as the design error is prepared in advance. The feature comparison means compares the feature of the configuration of the contact hole region recognized as the design error by the design means, with the feature stored in the feature storage file. After the comparison, if these features coincide, the invalidation means invalidates the recognition of the design error by the recognition means. Therefore, a contact hole region which should not be recognized as the design error is removed from the contact hole region recognized as the design error by the recognition means. That is, the occurrence of a pseudo design error recognition is prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a flow diagram of recognition invalidation portion shown in FIG. 1.

DESCRIPTION OF THE PREFERRED EMBODIMENTS

Figure 1:
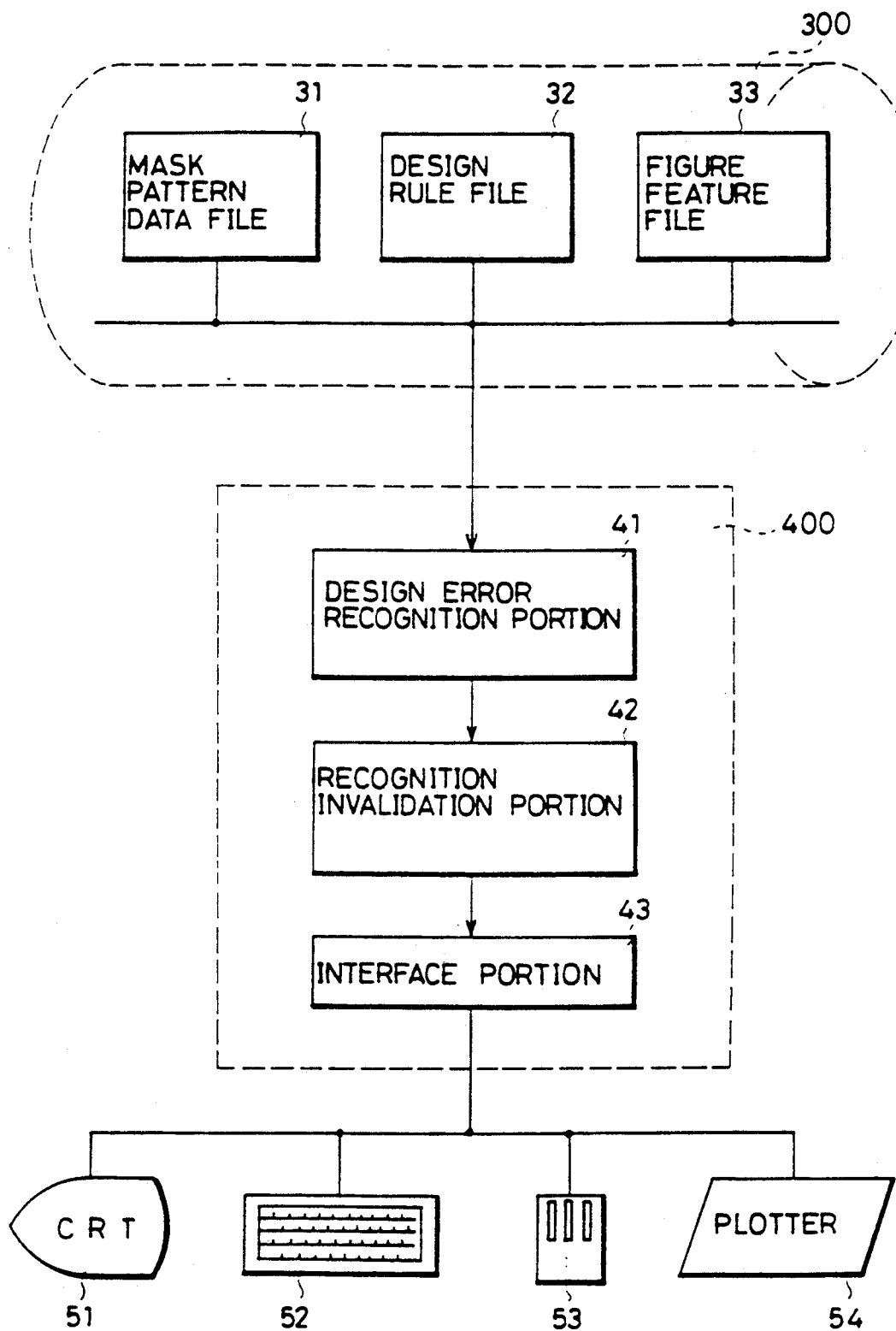
FIG. 1 is a block diagram of a design rule check apparatus representative of one embodiment of the present invention.
Figure 2A:
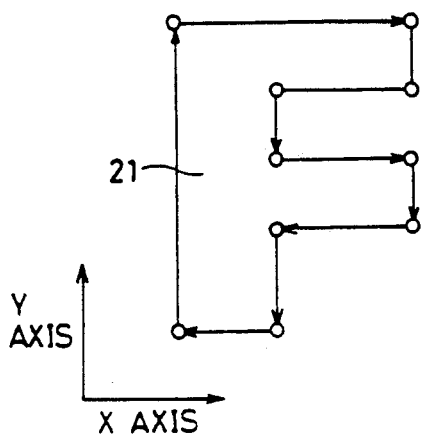
FIGS. 2A to 2G are characteristic diagrams showing examples of figure feature data stored in advance in the figure feature file shown in FIG. 1.
Figure 2B:
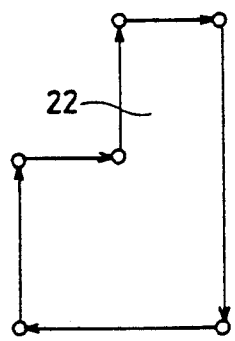
Figure 2C:
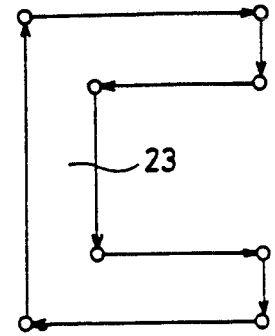
Figure 2D:
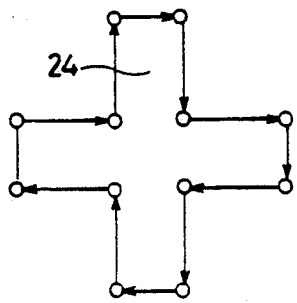
Figure 2E:
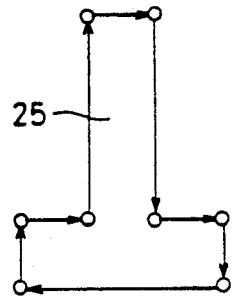
Figure 2F:
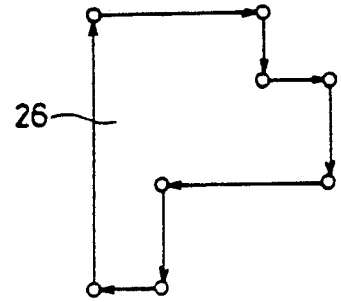
Figure 2G:
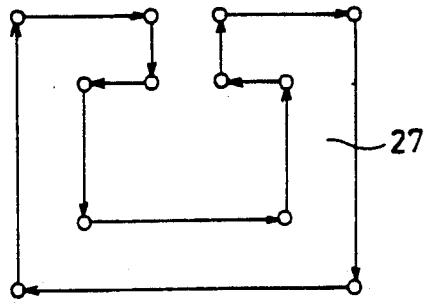
Figure 7:
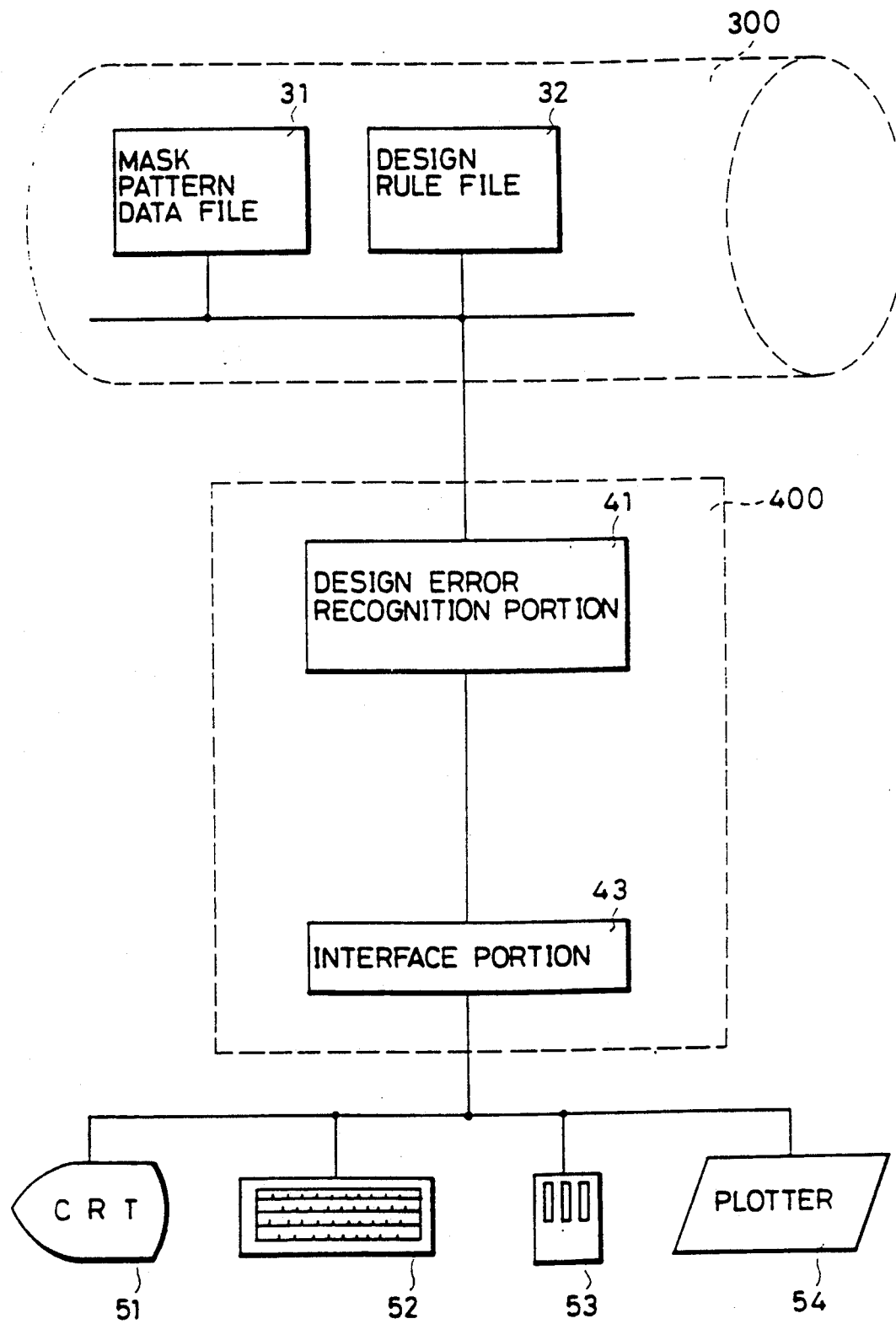
FIG. 7 is a block diagram of the design rule check apparatus which is a background of the present invention.
Figure 8:
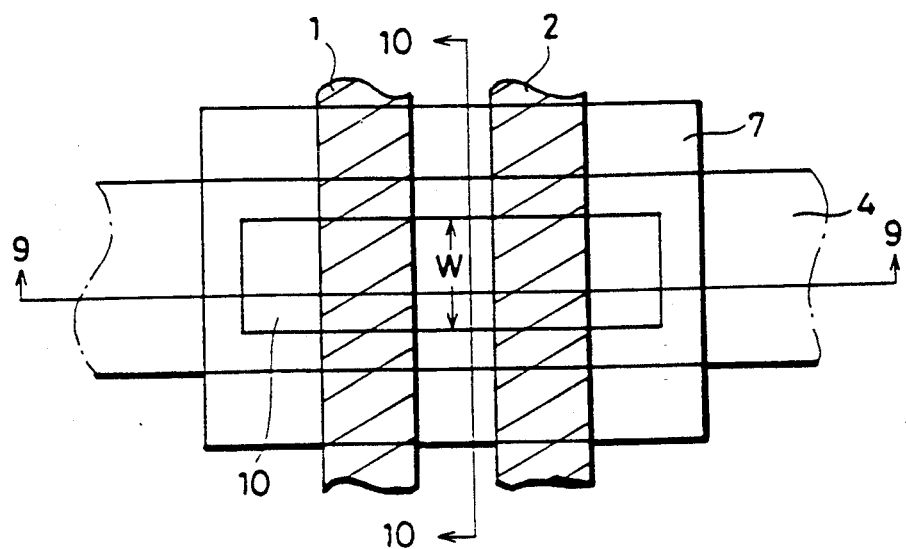
FIG. 8 is a plan view of a layout in the vicinity of a contact hole of an LSI.
Figure 9:
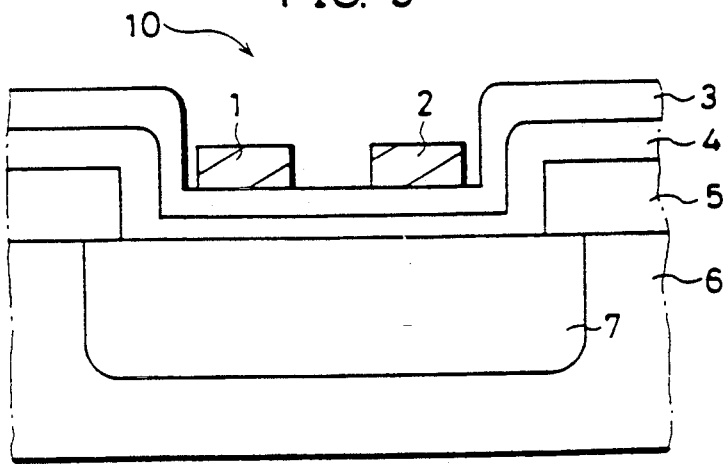
FIG. 9 is a sectional view of the LSI shown in FIG. 8 seen in the direction of an arrow 9.
Figure 10:
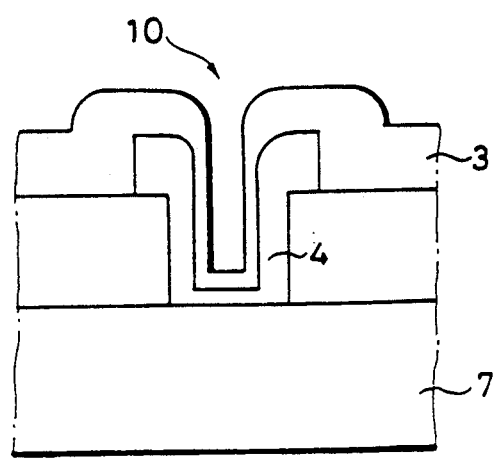
FIG. 10 is a sectional view of the LSI shown in FIG. 8 seen in the direction of an arrow 10.
Figure 11:
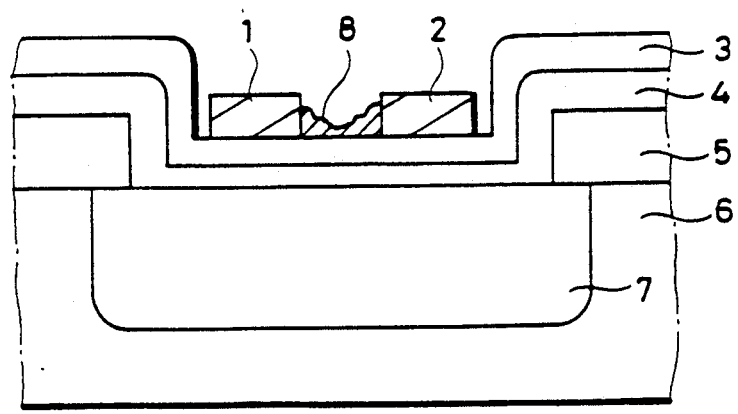
FIG. 11 is a sectional view showing the interconnection material left between the second interconnection layers shown in FIG. 8.

When the apparatus shown in FIG. 1 is compared with the conventional apparatus shown in FIG. 7, it is noted that a figure feature file 33 is provided in a memory 300, and a recognition invalidation portion 42 is provided in an operation processing portion 400. The description with regard to other portions is omitted as they are the same as those of the conventional apparatus shown in FIG. 7.

Referring to FIGS. 2A to 2G, FIGS. 21 to 27 are shown which define the configuration of the contact hole region that should not be recognized as a design error. For each FIG. 21 to 27, the change in the number of vertexes (0) Na and the direction of vectors connecting between each vertex is recognized as feature data, and prepared in the figure feature file 33 shown in FIG. 1. That is, each FIGS. 21 to 27 respectively shown in FIGS. A to 2G has 10, 6, 8, 12, 8, 8, and 14, as the number of vertexes Na. The direction of rotation of a vector is predetermined with respect to the change of vectors connecting between each vertex. That is, the direction of rotation is fixed to be clockwise in examples shown in FIGS. 2A to 2G. In addition, for each vector, the change of increase or decrease in the X axis and the Y axis direction is recognized in advance, and treated as data representative of the change in the direction of the vector. More detailed descriptions will be made later.

Figure 13:
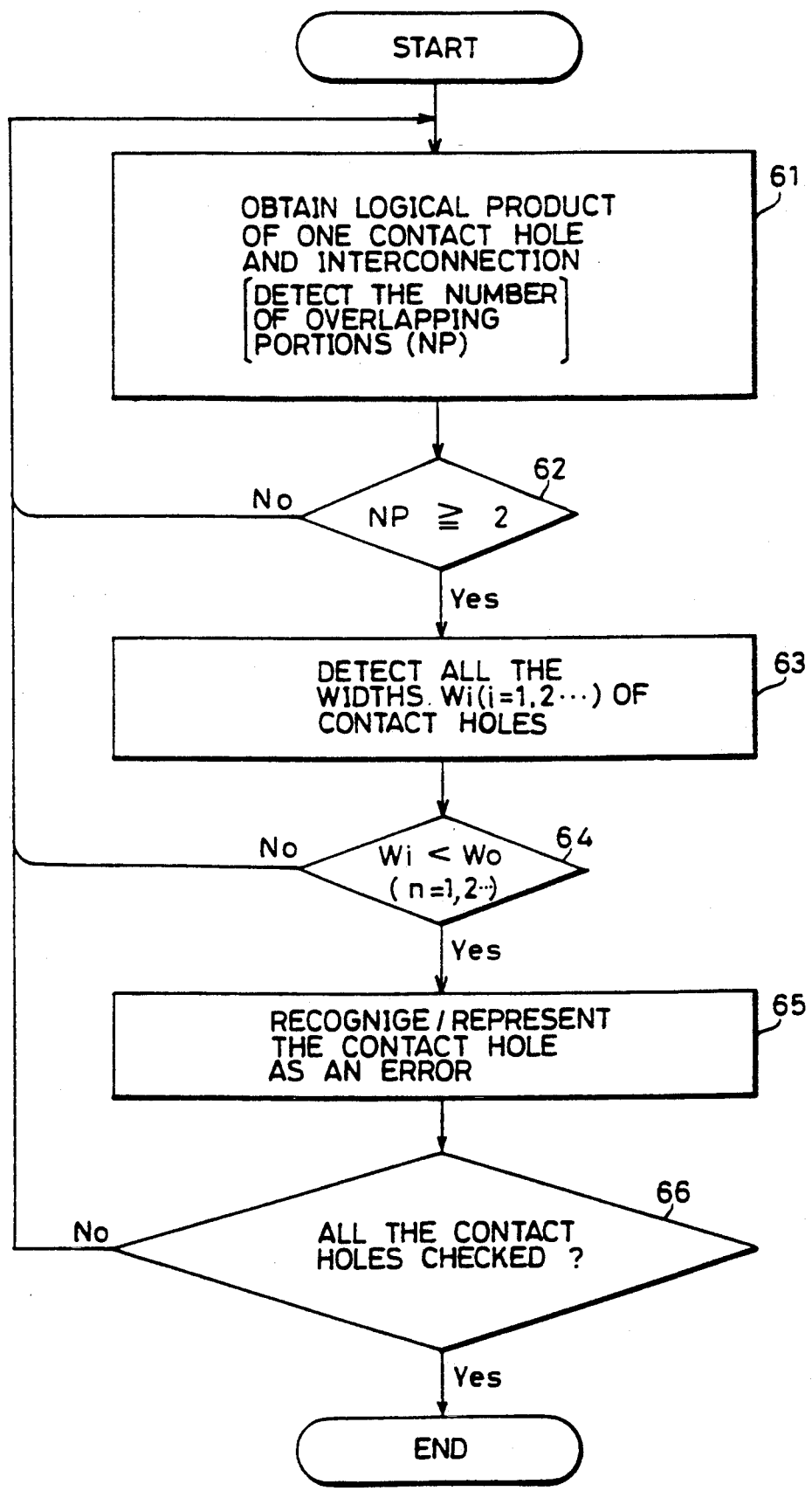
FIG. 13 is a flow diagram of the design error recognition portion shown in FIG. 7.

The details of the process in the recognition invalidation portion 42 of FIG. 1 is shown in FIG. 3. The design error recognition portion 41 shown in FIG. 1 is the same as the design error recognition portion 41 in the conventional apparatus shown in FIG. 7, so that, in accordance with the process flow shown in FIG. 13, the contact hole region recognized as a design error has been already detected. The recognition invalidation portion 42 removes a pseudo-error from the contact hole region recognized as a design error in accordance with the following procedure, by further effecting the process shown in FIG. 3.

Figure 6:
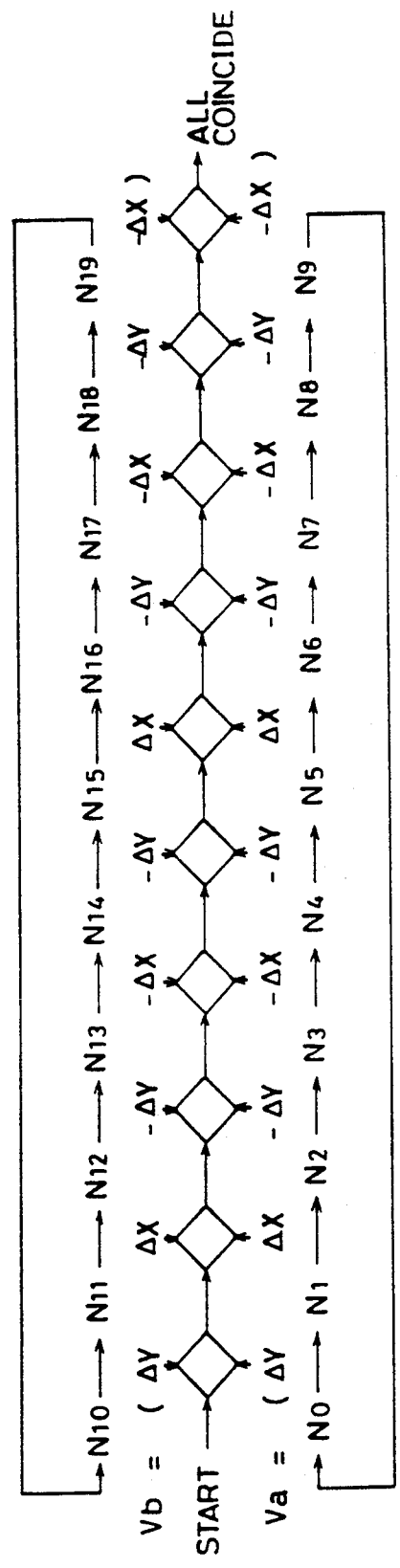
FIG. 6 is a typical diagram describing the comparing process in the step 74 shown in FIG. 3.
Figure 12:
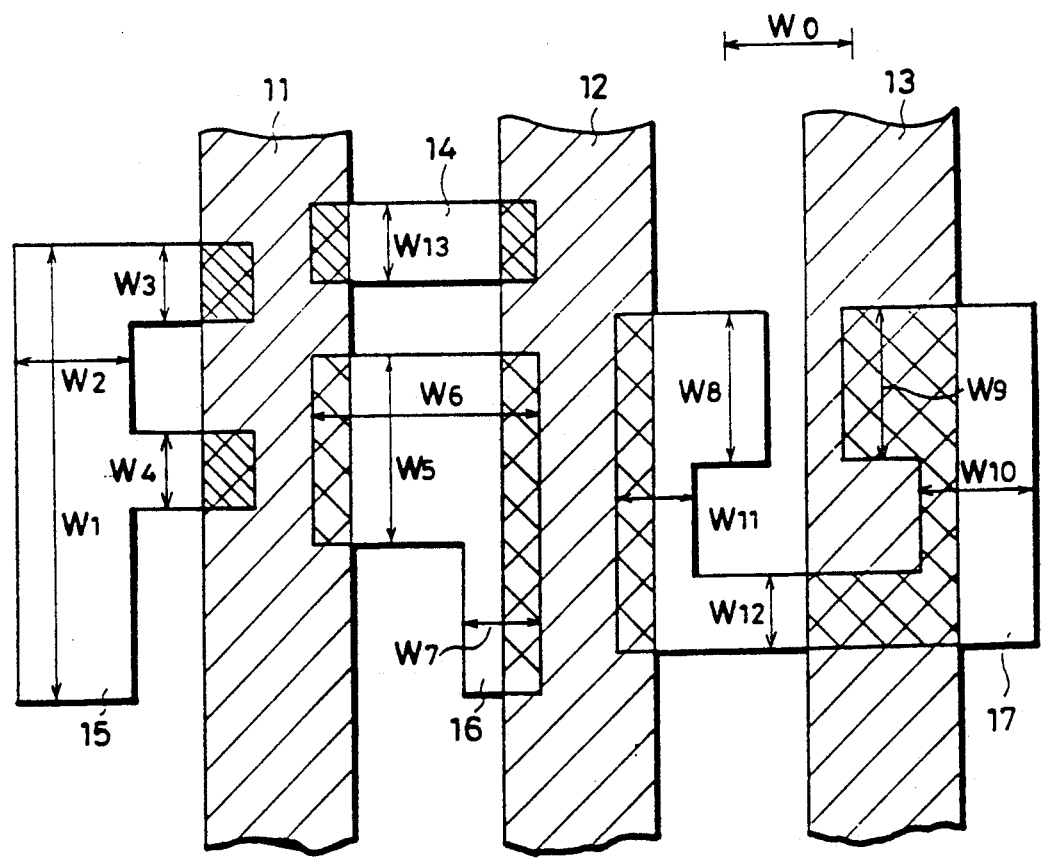
FIG. 12 is a plan view showing the relationship of the contact hole region and the interconnection layer in layout.

At first, in the step 71, the number of vertexes Na and vector data Va are read out with respect to the figures registered in the figure feature file 33. Then the number of vertexes Nb and the vector data Vb are detected in one contact hole region recognized as a design error by the design error recognition portion 41. That is, FIG. 4A shows the contact hole region 15 recognized as a design error in the example shown in FIG. 12. With the process in the step 72, it is detected the number of vertexes (◊) Nb=10 in the contact hole region 15 as shown in FIG. 4A. In addition, the vector data Vb in the contact hole region 15 as shown in FIG. 6 is detected. That is, increase or decrease in the X axis and the Y axis directions is detected which connects between each node N10 to N19, respectively rotating in the clockwise direction. As a result, the vector data Vb shown in the following equation is obtained.

$$Vb = (\Delta Y, \Delta X, \Delta Y, -\Delta X, \Delta Y, \Delta X, -\Delta Y, -\Delta X, -\Delta Y, -\Delta X) \quad (1)$$

where $\Delta X$ indicates the increase in the X axis direction, $-\Delta X$ the decrease in the X axis direction, $\Delta Y$ the increase in the Y axis direction, and $-\Delta Y$ the decrease in the Y axis direction.

Figure 5:
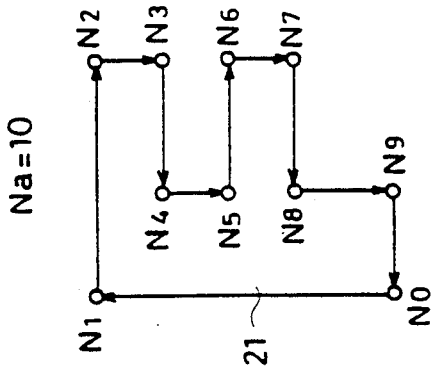
FIG. 5 is a characteristic diagram showing an example of figure feature data registered in the figure feature file.

In the step S71, the number of vertexes of the figure Na and the vector data Va have been read from the figure feature file 33 based on the registered FIG. 21 shown in FIG. 5. The vector data Va is expressed by the following equation:

$$Va = (\Delta Y, \Delta X, -\Delta Y, -\Delta X, -\Delta Y, \Delta X, -\Delta Y, -\Delta X, -\Delta Y, -\Delta X) \quad (2)$$

In the step 73, the number of vertexes Na read from the figure feature file 33 is compared with the number of vertexes Nb of the contact hole region. In this case, Na and Nb coincide, so that it proceeds to the step 74.

In the step 74, the vector data Va and the vector data Vb are compared. That is, the vector data Va expressed by the equation (2) is compared with the vector data Vb expressed by the equation (1). In this case, Va and Vb coincide, so that it proceeds to the next step 75. In the step 75, the error recognition and the error representation are invalidated which are recognized by the design error recognition portion 41 with respect to the contact hole region, i.e., the region 15. That is, as a result of the comparison process in the steps 73 and 74, it is determined that the feature of the figure of the contact hole region 15 shown in FIG. 4A coincide with the feature of the FIG. 21 shown in FIG. 5. It is recognized that the contact hole region 15 need not be treated as a design error. Accordingly, the error recognition of the contact hole region 15 is invalidated in the step 75.

In a step 76, it is determined if the above mentioned process has been completed with respect to the all contact hole regions recognized as a design error by the design error recognition portion 41. When the above mentioned process with respect to the all contact hole regions is completed, the process in the recognition invalidation portion 42 is finished. If the contact hole regions to be processed are still left or no coincidence is detected in the steps 73 and 74, it returns to the step 72, and the same process as the above mentioned is conducted with respect to one of other contact hole regions.

FIG. 6 shows the process in the step 74 more specifically. Vector data Va and vector data Vb are compared with each other for each corresponding item. When there is a coincidence for all pairs compared, it is determined that Va=Vb.

Figure 4B:
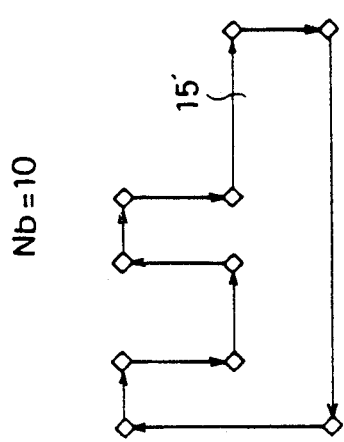
FIGS. 4A and 4B are plan views showing examples of the configurations of the contact hole regions recognized as a design error.
Figure 4A:
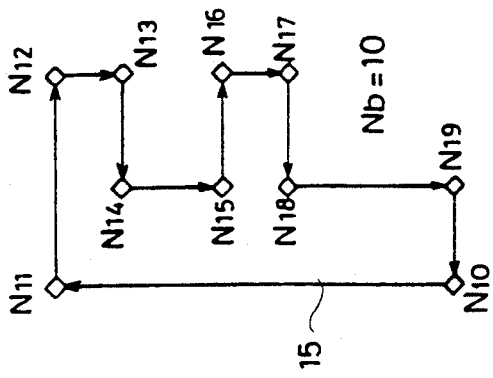

However, in the case in which the contact hole region 15' is arranged as shown in FIG. 4B, it also needs to be treated in the same way as in the FIG. 21 shown in FIG. 5. For that, the orders of the detected nodes N10 to N19 are adequately shifted, and the shifted vector data Vb' and vector data Va are compared. As a result, a match is also detected between the feature of the configuration of the contact hole region 15' and the feature of the configuration of the FIG. 21 in the case shown in FIG. 4B.

As seen from the description above, it is noted that the figure which is prepared in advance in the figure feature file 33 is not necessarily in congruent or similar relationship with the figure of the contact hole region to be checked. That is, an occurrence of a pseudo-design error may be determined by determining a coincidence in the features of the figures as shown in the above described example.

As stated above, the design rule check apparatus shown in FIG. 1 comprises a figure feature file 33 for storing in advance the feature of the configuration of a contact hole region which should not be recognized as a design error. In the design error recognition portion 41, after the process shown in FIG. 13, the recognition invalidation portion 42 effects the recognition invalidation process in accordance with the steps shown in FIG. 3 referring to the figure feature file. Accordingly, the contact hole region which is not required to be treated as a design error is removed from the design error group represented and recognized, so that it is not necessary for an operator to conduct discovering operation for a pseudo-error. Consequently, the working efficiency of an operator may be improved. In other words, it is made possible to automatically remove a contact hole practically having no problem from contact hole regions recognized not to satisfy the design rule.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A design rule test apparatus for testing if a designed semiconductor integrated circuit satisfies a predetermined design rule, comprising:

overlap detection means for detecting the overlap of one contact hole region and an interconnection region;

decision means for determining that there are two or more overlapping portions detected by said overlap detection means in said one contact hole region;

width comparison means for comparing the width of each portion in said one contact hole region determined by said decision means with a predetermined value in accordance with said design rule;

recognition means responsive to the result of the comparison by said width comparison means for recognizing said one contact hole region as a design error;

feature storage means for storing in advance the feature of the configuration of a contact hole region which should not be recognized as a design error;

feature comparison means for comparing the feature of the configuration of said one contact hole region recognized by said recognition means with the feature stored in said feature storage means; and invalidation means responsive to the result of the comparison by said feature comparison means for invalidating the recognition of the design error by said recognition means.

2. The design rule test apparatus according to claim 1, wherein the feature of the configuration of said one contact hole region is defined by the data of vectors surrounding said contact hole region, said feature storage means stores the data of the vectors surrounding said contact hole region which should not be recognized as the design error, and said feature comparison means compares the data of the vectors surrounding the contact hole region recognized by said recognition means with the vector data stored in said feature storage means.

3. The design rule test apparatus according to claim 2, wherein the feature of the configuration of said contact hole region is further defined by the number of vertexes of the configuration of said one contact hole region, said feature storage means further stores data of the number of vertexes of said configuration of said contact hole region which should not be recognized as a design error, and said feature comparison means further compares the data of the number of vertexes of the configuration in said one contact hole region recognized by said recognition means with the data stored in said feature storage means.

4. The design rule test apparatus according to claim 3, wherein said feature comparison means comprises:

first coincidence detection means for detecting a coincidence between the data of the vectors surrounding said one contact hole region recognized by said recognition means and the vector data stored in said feature storage means;

second coincidence detection means for detecting a coincidence between the data of the number of vertexes of the configuration of said one contact hole region recognized by said recognition means and the data of the number of vertexes stored in said feature storage means, and said invalidation means invalidates the recognition of the design error by said recognition means in response to said first and second coincidence detection means.

5. The design rule test apparatus according to claim 1, wherein said overlap detection means comprises logical product means for performing a logical product operation with regard to a figure of said one contact hole region and said interconnection region.

6. The design rule test apparatus according to claim 1, wherein said design rule test apparatus comprises a computer aided design apparatus for designing a mask pattern of a semiconductor integrated circuit.

7. An operating method of a design rule test apparatus for testing if a designed semiconductor integrated circuit satisfies a predetermined design rule, said apparatus comprising feature storage means for storing in advance the feature of the configuration of a contact hole region which should not be recognized as a design error, said operating method includes the steps of:

detecting the overlap of one contact hole region and an interconnection region;

determining that there are two or more overlapping portions in said one contact hole region detected in said overlap detecting step;

comparing the width of each portion in said one contact hole region determined in said determining step with a predetermined value in accordance with said design rule;

recognizing said one contact hole region as the design error in response to the result of the comparison in said width comparing step;

comparing the feature of the configuration of said one contact hole region recognized in said recognizing step with the feature stored in said feature storage means;

invalidating the recognition of said design error in response to the result of the comparison in said feature comparing step.

8. The operating method according to claim 7, wherein the feature of the configuration of said one contact hole region is defined by data of vectors surrounding said one contact hole region, said feature storage means stores the data of the vectors surrounding said contact hole region which should not be recognized as the design error, and said step of comparing said two features includes the step of comparing the data of the vectors surrounding said one contact hole region recognized in said recognizing step with the vector data stored in said feature storage means.

9. The operating method according to claim 8, wherein the feature of the configuration of said one contact hole region is further defined by the number of vertexes of the configuration of said one contact hole region, said feature storage means further stores data of the number of vertexes of said configuration of said contact hole region which should not be recognized as the design error, and said step of comparing said two features further includes the step of comparing the data of the number of vertexes of the configuration of said one contact hole region recognized in said recognizing step with the data stored in said feature storage means.

* * * * *